US012571593B2

(12) United States Patent
Tobe et al.

(10) Patent No.: US 12,571,593 B2
(45) Date of Patent: Mar. 10, 2026

(54) LIGHT IRRADIATION TYPE HEAT TREATMENT METHOD AND HEAT TREATMENT APPARATUS

(71) Applicant: SCREEN Holdings Co., Ltd., Kyoto (JP)

(72) Inventors: Ryuta Tobe, Kyoto (JP); Takahiro Kitazawa, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 918 days.

(21) Appl. No.: 17/825,155

(22) Filed: May 26, 2022

(65) Prior Publication Data

US 2022/0390175 A1    Dec. 8, 2022

(30) Foreign Application Priority Data

Jun. 7, 2021    (JP) ................................. 2021-095107

(51) Int. Cl.
*H01L 21/66*        (2006.01)
*F27B 17/00*        (2006.01)
(Continued)

(52) U.S. Cl.
CPC ............ *F27B 17/0025* (2013.01); *G01J 5/10* (2013.01); *H01L 22/12* (2013.01); *H05B 3/0047* (2013.01); *H01L 21/68785* (2013.01)

(58) Field of Classification Search
CPC . H01L 21/68785; H01L 22/12; H05B 3/0047; G01J 5/10; F27B 17/0025
(Continued)

(56) References Cited

U.S. PATENT DOCUMENTS 6,479,801 B1 * 11/2002 Shigeoka .............. G01J 5/0003
                                                                        392/416
8,901,460 B2 * 12/2014 Hashimoto ......... F27B 17/0025
                                                                        702/135
(Continued)

FOREIGN PATENT DOCUMENTS

CN         101689486 A      3/2010
CN         102197705 A      9/2011
(Continued)

OTHER PUBLICATIONS

Notice of Opinion On Examination and Search Report dated Mar. 7, 2023 in corresponding Taiwan Patent Application No. 111116690 with English machine translation.
(Continued)

*Primary Examiner* — Jimmy Chou
(74) *Attorney, Agent, or Firm* — OSTROLENK FABER LLP

(57)        ABSTRACT

An upper radiation thermometer is provided obliquely above a semiconductor wafer to be measured. The upper radiation thermometer includes a photovoltaic detector that produces an electromotive force when receiving light. The photovoltaic detector has both high-speed responsivity and good noise properties in a low-frequency range. The upper radiation thermometer does not require a mechanism for cooling because the photovoltaic detector is capable of obtaining sufficient sensitivity at room temperature without being cooled. There is no need to provide a light chopper and a differentiating circuit in the upper radiation thermometer. This allows the upper radiation thermometer to measure the front surface temperature of the semiconductor wafer with a simple configuration both during preheating by means of halogen lamps and during flash irradiation.

7 Claims, 8 Drawing Sheets

(51) Int. Cl.
  *G01J 5/10*      (2006.01)
  *H05B 3/00*      (2006.01)
  *H01L 21/687*    (2006.01)

(58) Field of Classification Search
  USPC .......................................................... 219/408
  See application file for complete search history.

(56)                References Cited

U.S. PATENT DOCUMENTS

| | | | | |
|---|---|---|---|---|
| 8,963,050 | B2 * | 2/2015 | Kato ................. | H01L 21/67115 |
| | | | | 219/385 |
| 9,025,943 | B2 * | 5/2015 | Kuroiwa ........... | H01L 21/67115 |
| | | | | 392/416 |
| 2002/0189757 | A1 | 12/2002 | Denton et al. | |
| 2010/0163183 | A1 | 7/2010 | Tanaka et al. | |
| 2011/0198342 | A1 | 8/2011 | Fujinami et al. | |
| 2012/0288261 | A1 * | 11/2012 | Hashimoto ........... | F27D 5/0037 |
| | | | | 392/416 |
| 2012/0288970 | A1 * | 11/2012 | Hashimoto ......... | F27B 17/0025 |
| | | | | 257/E21.211 |
| 2014/0206108 | A1 | 7/2014 | Kiyama | |
| 2015/0219000 | A1 | 8/2015 | Nojiri | |
| 2017/0133247 | A1 * | 5/2017 | Kiyama ............ | H01L 21/67248 |
| 2018/0240689 | A1 * | 8/2018 | Kitazawa .............. | H01L 21/681 |
| 2019/0141790 | A1 * | 5/2019 | Ito ..................... | H01L 21/67115 |
| 2019/0157168 | A1 * | 5/2019 | Kawarazaki .......... | H01L 21/324 |
| 2019/0267261 | A1 * | 8/2019 | Akiyoshi ............ | H01L 21/6719 |
| 2020/0013588 | A1 * | 1/2020 | Lian .................... | H01L 21/3065 |
| 2020/0381273 | A1 * | 12/2020 | Shigemasu ....... | H01L 21/67248 |
| 2021/0043477 | A1 * | 2/2021 | Kawarazaki ............ | H01L 22/12 |
| 2021/0057245 | A1 * | 2/2021 | Ueno ................... | H01L 21/324 |
| 2021/0272827 | A1 | 9/2021 | Nakajima et al. | |
| 2022/0063050 | A1 | 3/2022 | Matsuo | |

FOREIGN PATENT DOCUMENTS

| | | | |
|---|---|---|---|
| CN | 104541139 | A | 4/2015 |
| CN | 105849517 | A | 8/2016 |
| CN | 109755158 | A | 5/2019 |
| CN | 112349587 | A | 2/2021 |
| JP | H05-13355 | A | 1/1993 |
| JP | 2001-021420 | A | 1/2001 |
| JP | 2003-207524 | A | 7/2003 |
| JP | 2009-276201 | A | 11/2009 |
| JP | 2010-225613 | A | 10/2010 |
| JP | 2012-238779 | A | 12/2012 |
| JP | 2012-238782 | A | 12/2012 |
| JP | 2014-185898 | A | 10/2014 |
| JP | 2015-135930 | A | 7/2015 |
| JP | 2020-004764 | A | 1/2020 |
| JP | 2020-046363 | A | 3/2020 |
| JP | 2020-110859 | A | 7/2020 |
| KR | 10-2021-0015908 | A | 2/2021 |
| KR | 10-2021-0018116 | A | 2/2021 |
| WO | WO 2015/099995 | A1 | 7/2015 |

OTHER PUBLICATIONS

Request for the Submission of an Opinion dated Jan. 30, 2024 in corresponding Korean Patent Application No. 10-2022-0066647 and a computer generated English translation obtained from the JPO.

Notice of Reasons for Refusal dated Apr. 8, 2025 in corresponding Japanese Patent Application No. 2021-095107 and English language machine translation.

First Office Action with Search Report dated Sep. 4, 2024 in corresponding Chinese Patent Application No. 202210579872.2 and a computer generated English translation made from the Japanese translation of the original communication.

Kouji Hagiwara, Hao Wenjie, 1993, "Fiber Optic Thermometer", Sensor & Transducer Technology, No. 6.

Third Office Action with Search Report dated May 22, 2025 in corresponding Chinese Patent Application No. 202210579872.2 and English language translation obtained from Global Dossier.

"Digital Elevation Models and Applications Thereof," Harbin Engineering University Press, Aug. 31, 2012, pp. 26-29. The English language translation is not available, however the document is briefly described in the Third Office Action.

Notice of Reasons for Refusal dated Dec. 3, 2024 in corresponding Japanese Patent Application No. 2021-095107 and a computer generated English translation obtained from the JPO.

Notice of Decision to Grant dated Jun. 23, 2025 in corresponding Korean Patent Application No. 10-2022-0066647.

Request for the Submission of an Opinion dated Oct. 2, 2024 in corresponding Korean Patent Application No. 10-2022-0066647 and a computer generated English translation obtained from the JPO.

Declaration of Refusal of the State Intellectual Property Office of the People's Republic of China dated Jul. 24, 2025 in corresponding Chinese Patent Application No. 202210579872.2 with English language translation.

Second Office Action with Search Report dated Mar. 12, 2025 in corresponding Chinese Patent Application No. 202210579872.2 and a computer generated English translation obtained from the JPO.

\* cited by examiner

F I G. 6
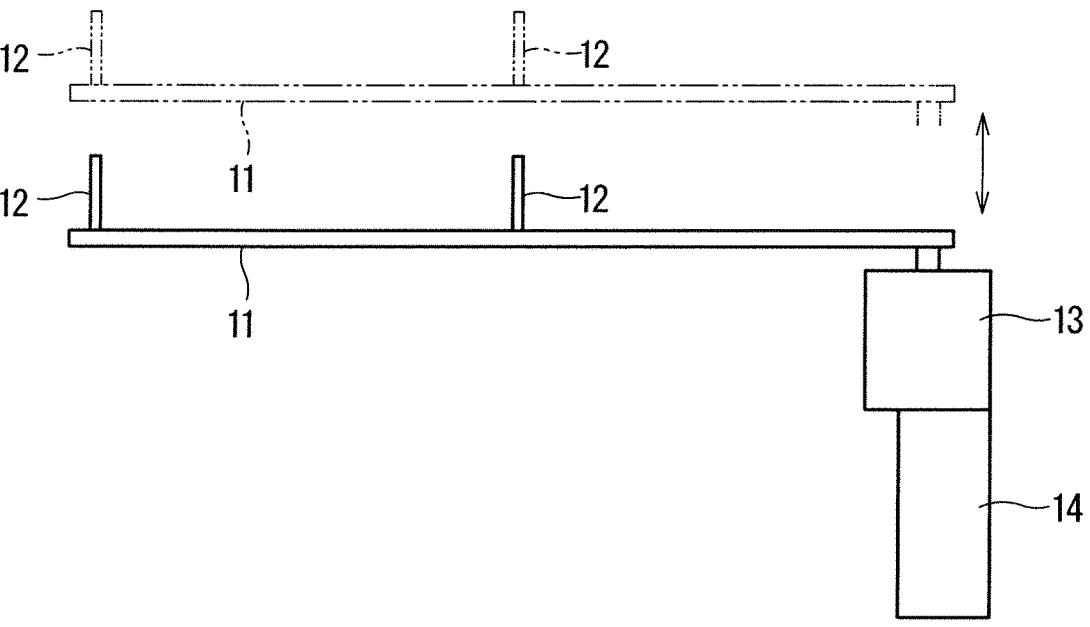
F I G. 7
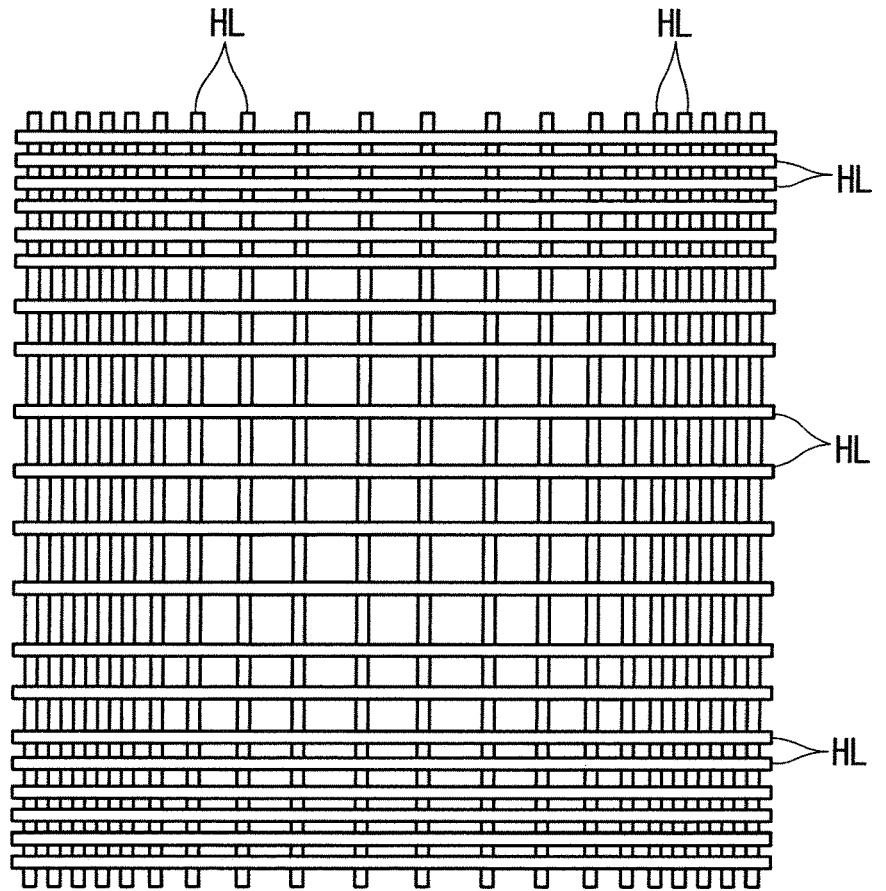

F I G. 9
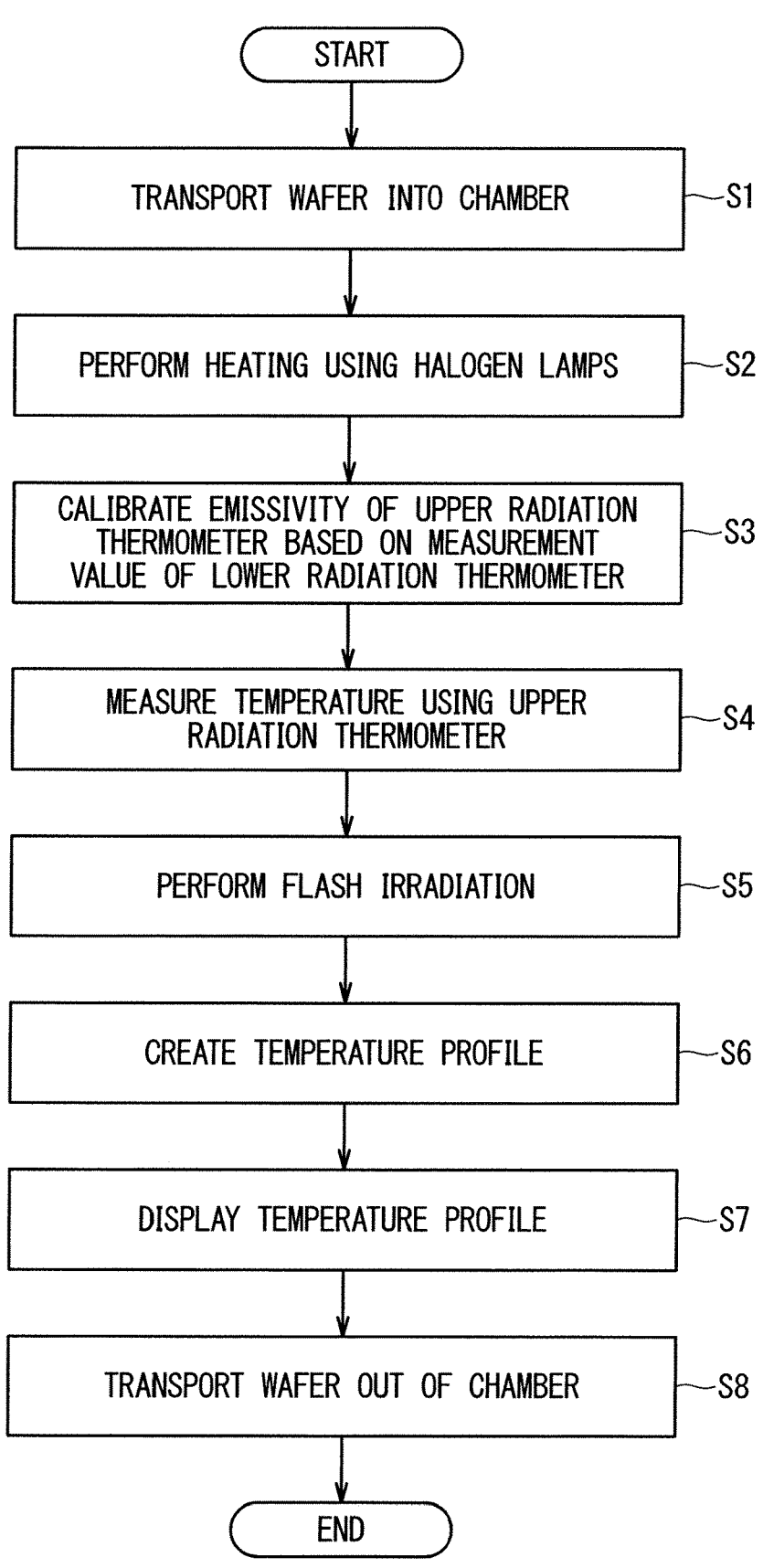

LIGHT IRRADIATION TYPE HEAT TREATMENT METHOD AND HEAT TREATMENT APPARATUS

BACKGROUND OF THE INVENTION

Field of the Invention

The present invention relates to a heat treatment method and a heat treatment apparatus which irradiate a thin plate-like precision electronic substrate (hereinafter referred to simply as a "substrate") such as a semiconductor wafer with a flash of light to heat the substrate.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

Such flash lamp annealing is used for processes that require heating in an extremely short time, e.g. typically for the activation of impurities implanted in a semiconductor wafer. The irradiation of the surface of the semiconductor wafer implanted with impurities by an ion implantation process with a flash of light emitted from the flash lamps allows the temperature rise in the surface of the semiconductor wafer to an activation temperature only for an extremely short time, thereby achieving only the activation of the impurities without deep diffusion of the impurities.

Not only in the flash lamp annealing but also in the heat treatment of a semiconductor wafer, it is important to control the temperature of the wafer. To this end, it is necessary to accurately measure the temperature of the semiconductor wafer during the heat treatment. In the flash lamp annealing, it is particularly important to accurately measure the surface temperature of the semiconductor wafer which changes rapidly during the flash irradiation. U.S. Patent Application Publication No. 2012/0288970 discloses a technique in which a radiation thermometer is used to measure the surface temperature of a semiconductor wafer during the flash irradiation.

Thermal detection elements such as thermopiles are not capable of following temperature changes in the surface temperature of a semiconductor wafer which rises and falls rapidly during the flash irradiation. For this reason, a conventional radiation thermometer that measures the surface temperature of a semiconductor wafer to be irradiated with a flash of light is provided with a photoconductive detector that is a quantum detection element. However, the photoconductive detector has a poor signal-to-noise ratio in a low-frequency range and is required to be cooled below the freezing point (e.g., −25° C.) to obtain high sensitivity. Even if the photoconductive detector is cooled below the freezing point, a thermometer enclosure for housing the element is still at room temperature. This results in a poor heat balance of the entire radiation thermometer. It is hence necessary to provide a light chopper for separation between background light from the thermometer enclosure and measurement light. This, however, causes a temperature measurement system to become larger and more complex.

SUMMARY

The present invention is intended for a method of irradiating a substrate with a flash of light to heat the substrate.

According to one aspect of the present invention, the method comprises the steps of: (a) receiving a substrate in a chamber; (b) preheating the substrate by means of light irradiation from a continuous lighting lamp; and (c) irradiating a front surface of the substrate with a flash of light from a flash lamp, wherein a temperature of the substrate is measured by a first radiation thermometer including a photovoltaic detector.

There is no need to provide a light chopper in the photovoltaic detector. This allows the measurement of the temperature of the substrate to be made with a simple configuration during the flash irradiation.

Preferably, the first radiation thermometer executes a first measurement mode and a second measurement mode in parallel to measure the temperature of the substrate, the first measurement mode being a measurement mode in which data acquisition is performed at a first sampling interval, the second measurement mode being a measurement mode in which data acquisition is performed at a second sampling interval shorter than the first sampling interval.

The data acquisition is appropriately performed both during the preheating and during the flash heating.

Preferably, temperature values obtained by temperature conversion of data acquired in the second measurement mode are interpolated into temperature values obtained by temperature conversion of data acquired in the first measurement mode, and a result of the interpolation is displayed on a display part.

Changes in temperature of the substrate from the preheating to the flash heating are depicted with high accuracy.

Preferably, a process using a digital filter is performed on a signal outputted from the photovoltaic detector.

Signals are processed both during the preheating and the flash heating through the use of common hardware.

The present invention is also intended for a heat treatment apparatus for irradiating a substrate with a flash of light to heat the substrate.

According to one aspect of the present invention, the heat treatment apparatus comprises: a chamber for receiving a substrate therein; a continuous lighting lamp for irradiating the substrate with light to preheat the substrate; a flash lamp for irradiating a front surface of the substrate with a flash of light to flash-heat the substrate; and a first radiation thermometer including a photovoltaic detector and for measuring a temperature of the substrate.

There is no need to provide a light chopper in the photovoltaic detector. This allows the measurement of the temperature of the substrate to be made with a simple configuration during the flash irradiation.

Preferably, the first radiation thermometer executes a first measurement mode and a second measurement mode in parallel to measure the temperature of the substrate, the first measurement mode being a measurement mode in which data acquisition is performed at a first sampling interval, the second measurement mode being a measurement mode in which data acquisition is performed at a second sampling interval shorter than the first sampling interval.

The data acquisition is appropriately performed both during the preheating and during the flash heating.

Preferably, the heat treatment apparatus further comprises a display part for displaying a result of interpolation of temperature values obtained by temperature conversion of data acquired in the second measurement mode into temperature values obtained by temperature conversion of data acquired in the first measurement mode.

Changes in temperature of the substrate from the preheating to the flash heating are depicted with high accuracy.

Preferably, a process using a digital filter is performed on a signal outputted from the photovoltaic detector.

Signals are processed both during the preheating and the flash heating through the use of common hardware.

It is therefore an object of the present invention to measure the temperature of a substrate during flash irradiation with a simple configuration.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a side view of the transfer mechanism;

FIG. 7 is a plan view showing an arrangement of halogen lamps;

FIG. 9 is a flow diagram showing a procedure for a treatment operation in the heat treatment apparatus of FIG. 1;

DESCRIPTION OF THE PREFERRED EMBODIMENTS

A preferred embodiment according to the present invention will now be described in detail with reference to the drawings.

Figure 1:
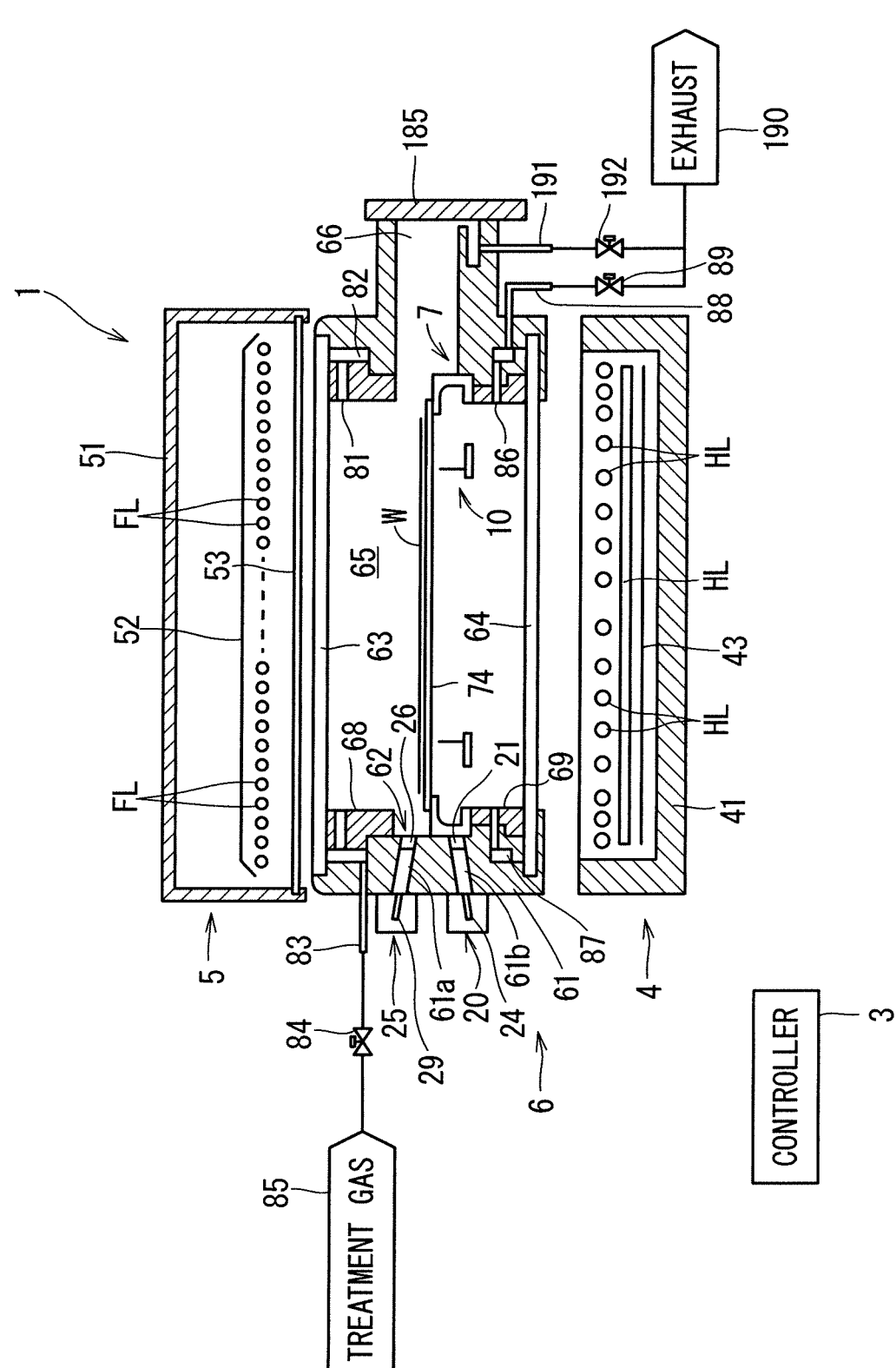
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm (in the present preferred embodiment, 300 mm). It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a and a through hole 61b both bored therein. The through hole 61a is a cylindrical hole for directing infrared light emitted from an upper surface of a semiconductor wafer W held by a susceptor 74 to be described later therethrough to an upper sensor 29 of an upper radiation thermometer 25. The through hole 61b is a cylindrical hole for directing infrared light emitted from a lower surface of the semiconductor wafer W therethrough to an infrared sensor 24 of a lower radiation thermometer 20. The through holes 61a and 61b are inclined with respect to a horizontal direction so that the longitudinal axes (axes extending in respective directions in which the through holes 61a and 61b extend through the chamber side portion 61) of the respective through holes 61a and 61b intersect main surfaces of the semiconductor wafer W held by the susceptor 74. A transparent window 26 made of calcium fluoride material transparent to infrared light in a wavelength range measurable with the upper radiation thermometer 25 is mounted to an end portion of the through hole 61a which faces the heat treatment space 65. A transparent window 21 made of barium fluoride material transparent to infrared light in a wavelength range measurable with the lower radiation thermometer 20 is mounted to an end portion of the through hole 61b which faces the heat treatment space 65.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is interposed in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), and mixtures of these gases (although nitrogen gas is used in the present preferred embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is interposed in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The treatment gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
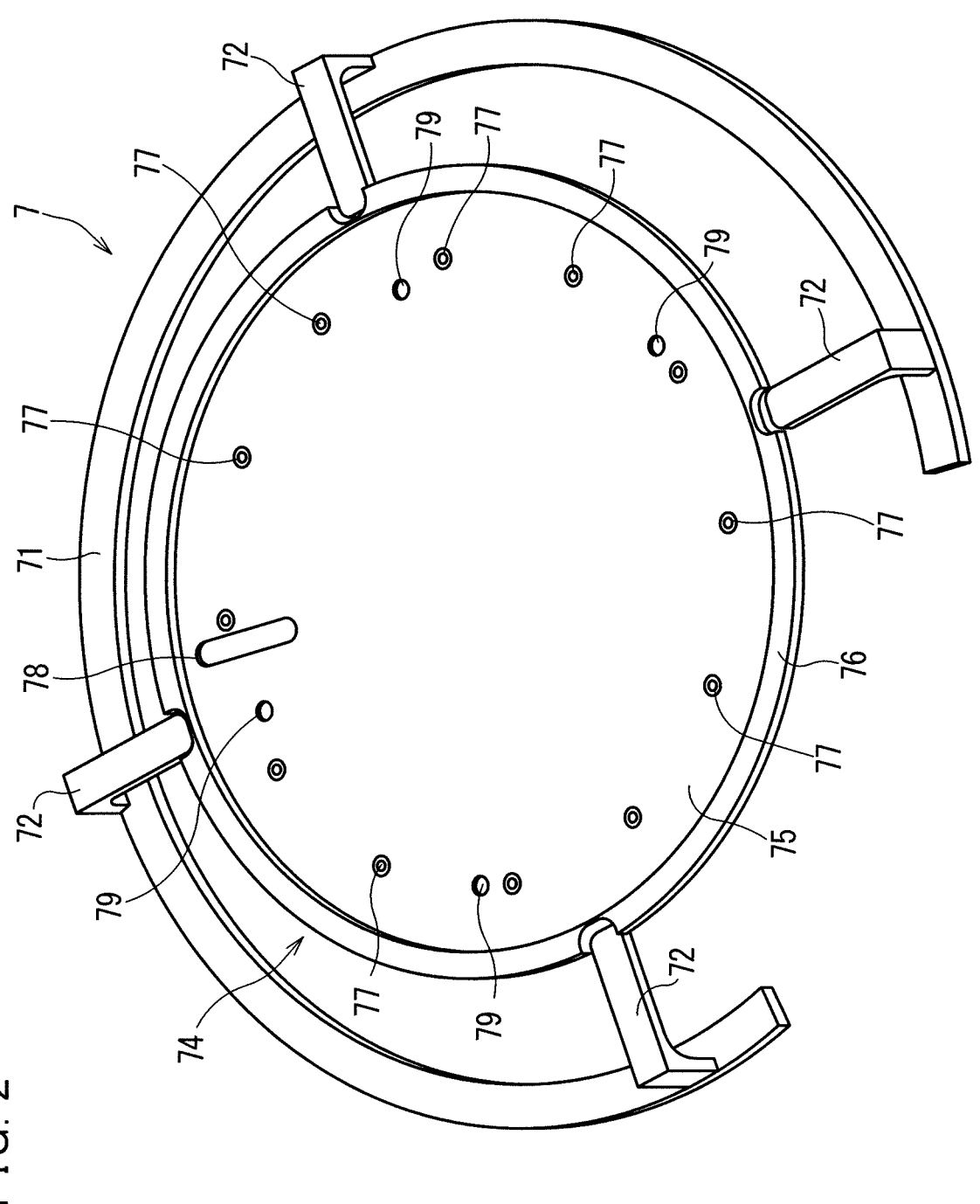
FIG. 2 is a perspective view showing the entire external appearance of a holder.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figures 3, 4:
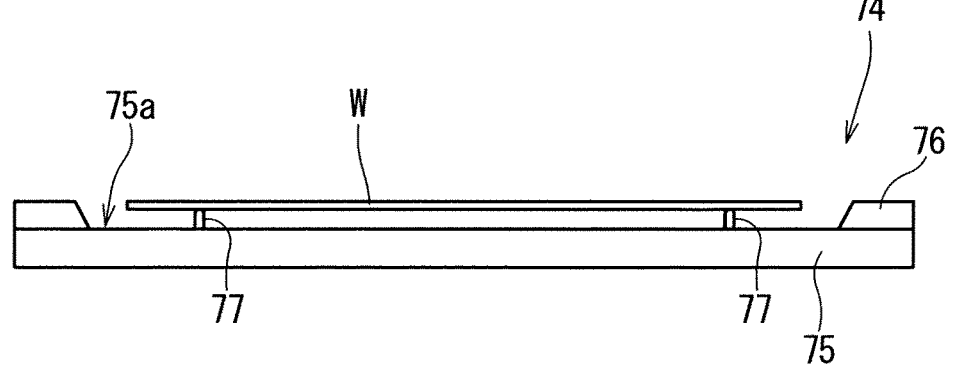
FIG. 3 is a plan view of a susceptor.
FIG. 4 is a sectional view of the susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is provided in the holding plate 75 of the susceptor 74 so as to extend vertically through the holding plate 75 of the susceptor 74. The opening 78 is provided for the lower radiation thermometer 20 to receive radiation (infrared light) emitted from the lower surface of the semiconductor wafer W. Specifically, the lower radiation thermometer 20 receives the radiation emitted from the lower surface of the semiconductor wafer W through the opening 78 and the transparent window 21 mounted to the through hole 61b in the chamber side portion 61 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
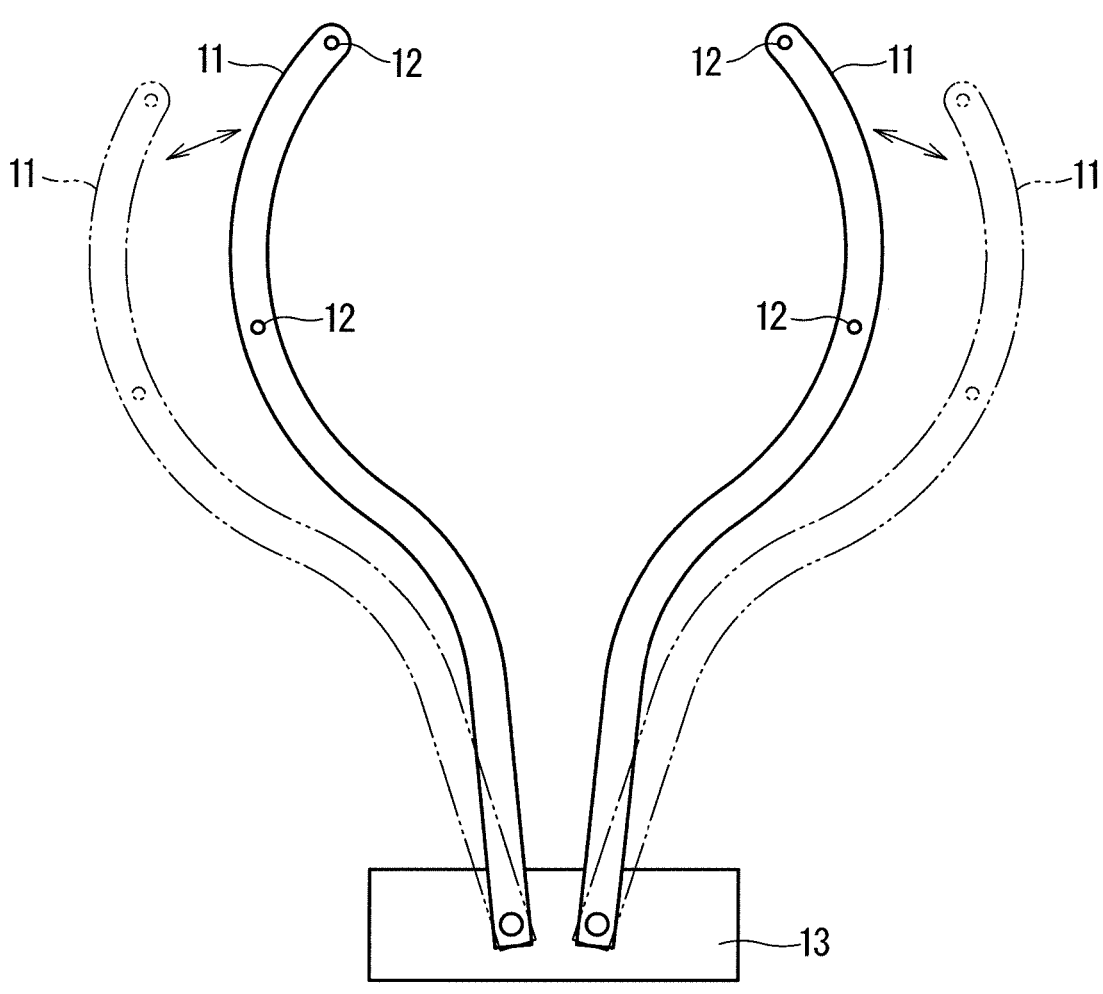
FIG. 5 is a plan view of a transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 directs light from under the chamber 6 through the lower chamber window 64 toward the heat treatment space 65 to heat the semiconductor wafer W by means of the halogen lamps HL.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in a peripheral portion of the lamp arrangement than in a central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

Figure 8:
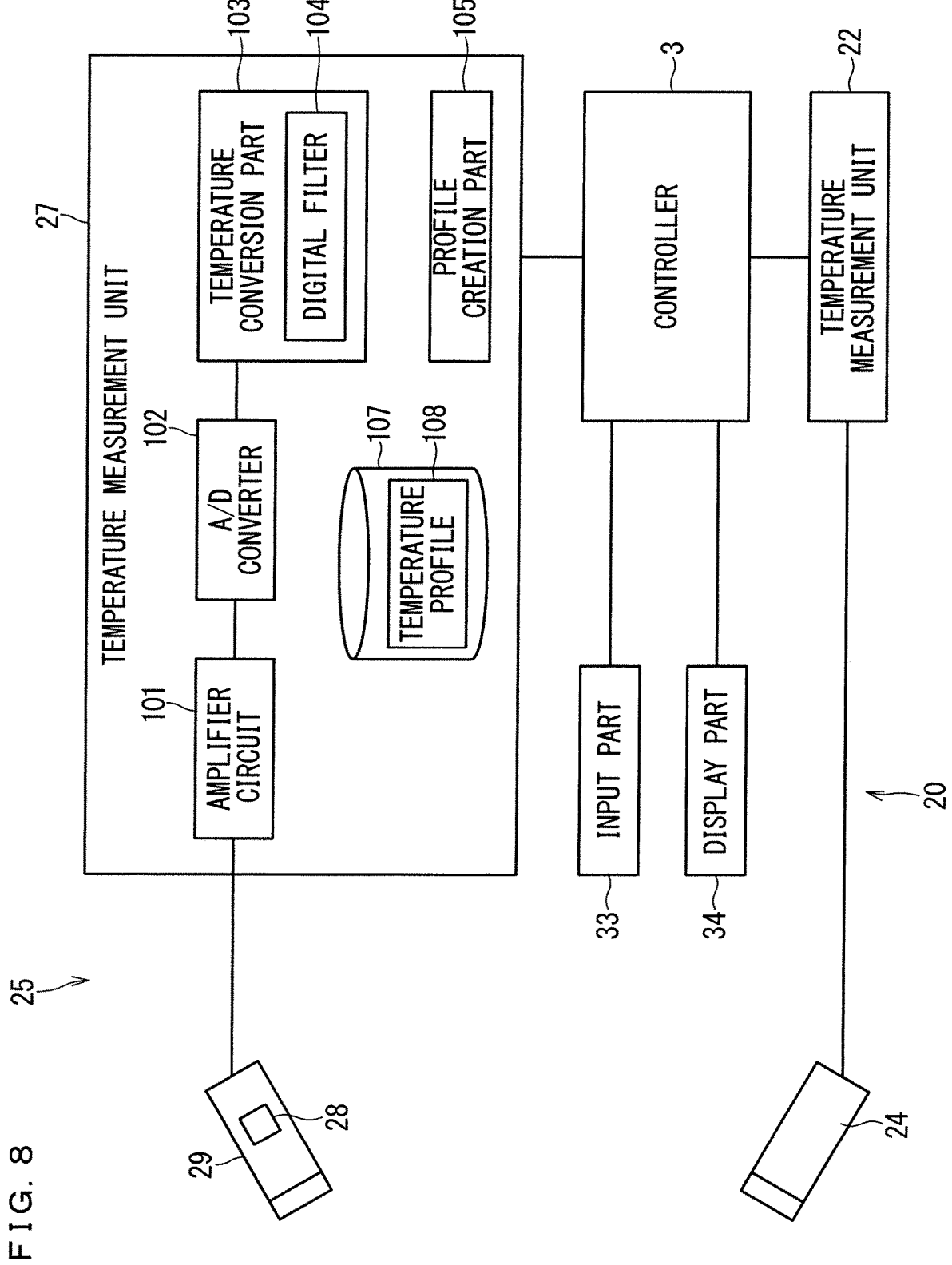
FIG. 8 is a functional block diagram of an upper radiation thermometer and a lower radiation thermometer.

As shown in FIG. 1, the chamber 6 is provided with the two radiation thermometers: the upper radiation thermometer (a first radiation thermometer) 25 and the lower radiation thermometer (a second radiation thermometer) 20. FIG. 8 is a functional block diagram of the upper radiation thermometer 25 and the lower radiation thermometer 20. The upper radiation thermometer 25 is provided obliquely above the semiconductor wafer W held by the susceptor 74, and measures the temperature of the upper surface of the semiconductor wafer W. The upper radiation thermometer 25 includes the infrared sensor 29 and a temperature measurement unit 27. The infrared sensor 29 receives infrared light emitted from the upper surface of the semiconductor wafer W held by the susceptor 74. The infrared sensor 29 of the upper radiation thermometer 25 incorporates a photovoltaic detector 28 so as to be able to respond to rapid changes in temperature of the upper surface of the semiconductor wafer W at the moment of flash irradiation. The photovoltaic detector 28 is an element that produces an electromotive force through a photoelectric effect when receiving light, and is made of InSb (indium antimonide), for example. The higher the temperature of a light emitter of infrared light being received is, the higher electromotive force the photovoltaic detector 28 produces.

While the conventional photoconductive detector has a poor signal-to-noise ratio especially in a low-frequency range, the photovoltaic detector 28 exhibits good noise properties even in the low-frequency range. That is, the upper radiation thermometer 25 which employs the photovoltaic detector 28 has both high-speed responsivity and good noise properties in the low-frequency range. Also, the photoconductive detector has been required to be cooled below the freezing point to obtain high sensitivity. The temperature around the photoconductive detector has been increased by the execution of heat treatment because the infrared sensor 29 is provided on the chamber side portion 61 (as shown in FIG. 1). As a result, there have been cases in which the photoconductive detector is cooled insufficiently. The insufficient cooling of the photoconductive detector has precluded the upper radiation thermometer 25 from measuring the temperature of the upper surface of the semiconductor wafer W to thereby preclude the heat treatment apparatus 1 from operating in some cases. On the other hand, there are some photovoltaic detectors 28 capable of obtaining sufficient sensitivity at room temperature (10° to 60° C.) without being cooled. For this reason, the upper radiation thermometer 25 including the photovoltaic detector 28 driven even at room temperature maintains a heat balance that is substantially good entirely at room temperature to minimize a zero drift as compared with the conventional photoconductive detector, thereby eliminating the need to provide a light chopper. In addition, the photovoltaic detector 28 driven at room temperature, which does not require a Peltier element for cooling or a mechanism for preventing dew condensation caused by cooling, may be made in chip form and reduced in size. As a result, increases in size and complexity of the upper radiation thermometer 25 employing the photovoltaic detector 28 are suppressed. This makes it advantageous to mount the upper radiation thermometer 25 in a flash lamp annealer that is often limited in installation space.

The temperature measurement unit 27 includes an amplifier circuit 101, an A/D converter 102, a temperature conversion part 103, a profile creation part 105, and a storage part 107. A signal of electromotive force produced in the photovoltaic detector 28 by infrared light emitted from the semiconductor wafer W and received by the infrared sensor 29 is outputted to the amplifier circuit 101. The amplifier circuit 101 amplifies the electromotive force signal outputted from the infrared sensor 29 to transmit the amplified electromotive force signal to the A/D converter 102. The A/D converter 102 converts the electromotive force signal amplified by the amplifier circuit 101 into a digital signal.

The temperature conversion part 103 and the profile creation part 105 are functional processing parts implemented by a CPU (not shown) mounted in the temperature measurement unit 27 executing a predetermined processing program. The temperature conversion part 103 performs a predetermined computation process on the signal outputted from the A/D converter 102, i.e. the signal indicative of the intensity of the infrared light received by the infrared sensor 29, to convert the signal into a temperature. The temperature determined by the temperature conversion part 103 is the temperature of the upper surface of the semiconductor wafer W.

The profile creation part 105 sequentially accumulates temperature data acquired by the temperature conversion part 103 in the storage part 107 to thereby create a temperature profile 108 showing changes in temperature of the upper surface of the semiconductor wafer W over time. A known storage medium such as a magnetic disk and a memory may be used as the storage part 107. The creation of the temperature profile will be described in more detail later.

On the other hand, the lower radiation thermometer 20 is provided obliquely below the semiconductor wafer W held by the susceptor 74, and measures the temperature of the lower surface of the semiconductor wafer W. The lower radiation thermometer 20 includes the infrared sensor 24 and a temperature measurement unit 22. The infrared sensor 24 receives infrared light emitted from the lower surface of the semiconductor wafer W held by the susceptor 74 through the opening 78. The infrared sensor 24 of the lower radiation thermometer 20 includes, for example, a thermopile as a light receiving element because the infrared sensor 24 need not support high-speed measurement as supported by the upper radiation thermometer 25. The infrared sensor 24 outputs a signal generated in response to the received light to the temperature measurement unit 22. The temperature measurement unit 22 includes an A/D converter, a temperature conversion part, and the like all not shown, and converts a signal indicative of the intensity of the infrared light outputted from the infrared sensor 24 into a temperature. The temperature determined by the temperature measurement unit 22 is the temperature of the lower surface of the semiconductor wafer W.

The lower radiation thermometer 20 and the upper radiation thermometer 25 are electrically connected to the controller 3 that is a controller for the entire heat treatment apparatus 1. The temperatures of the lower surface and the upper surface of the semiconductor wafer W which are measured by the lower radiation thermometer 20 and the upper radiation thermometer 25, respectively, are transmitted to the controller 3. The controller 3 controls various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like thereon. The CPU in the controller 3 executes a predetermined processing program, whereby the processes in the heat treatment apparatus 1 proceed.

The controller 3 is connected to a display part 34 and an input part 33. The controller 3 causes a variety of pieces of information to appear on the display part 34. An operator of the heat treatment apparatus 1 may input various commands and parameters from the input part 33 while viewing the information appearing on the display part 34. A keyboard and a mouse, for example, may be used as the input part 33. A liquid crystal display, for example, may be used as the display part 34. In the present preferred embodiment, a liquid crystal touch panel provided on an outer wall of the heat treatment apparatus 1 is used to function as both the display part 34 and the input part 33.

The heat treatment apparatus 1 further includes, in addition to the aforementioned components, various cooling structures to prevent an excessive temperature rise in the halogen heating part 4, the flash heating part 5, and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a treatment operation in the heat treatment apparatus 1 will be described. FIG. 9 is a flow diagram showing a procedure for the treatment operation in the heat treatment apparatus 1. The procedure for the treatment of the semiconductor wafer W which will be described below proceeds under the control of the controller 3 over the operating mechanisms of the heat treatment apparatus 1.

Prior to the treatment of the semiconductor wafer W, the valve 84 for supply of gas is opened, and the valve 89 for exhaust of gas is opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with process steps.

Subsequently, the gate valve 185 is opened to open the transport opening 66. A transport robot outside the heat treatment apparatus 1 transports a semiconductor wafer W to be treated through the transport opening 66 into the heat treatment space 65 of the chamber 6 (Step S1). At this time, there is a danger that an atmosphere outside the heat treatment apparatus 1 is carried into the heat treatment space 65 as the semiconductor wafer W is transported into the heat treatment space 65. However, the nitrogen gas is continuously supplied into the chamber 6. Thus, the nitrogen gas flows outwardly through the transport opening 66 to minimize the outside atmosphere carried into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof that is a surface to be treated is the upper surface. A predetermined distance is defined between a back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held from below in a horizontal attitude by the susceptor 74 of the holder 7 made of quartz, the 40 halogen lamps HL in the halogen heating part 4 turn on simultaneously to start preheating (or assist-heating) (Step S2). Halogen light emitted from the halogen lamps HL is transmitted through the lower chamber window 64 and the susceptor 74 both made of quartz, and impinges upon the lower surface of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W which is on the increase by the irradiation with light from the halogen lamps HL is measured by the lower radiation thermometer 20. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured by the lower radiation thermometer 20. The lower radiation thermometer 20 functions as a control temperature sensor for controlling the output from the halogen lamps HL during the preheating of the semiconductor wafer W.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured by the lower radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

While the temperature of the semiconductor wafer W is maintained at the preheating temperature T1 by the execution of the preheating, emissivity calibration of the upper radiation thermometer 25 is performed (Step S3). The emissivity calibration of the upper radiation thermometer 25 is performed based on the temperature measurement value of the lower radiation thermometer 20. The emissivity of the lower radiation thermometer 20 is previously accurately calibrated. The emissivity calibration of the lower radiation thermometer 20 is performed, for example, using a wafer with a thermocouple. Specifically, while the wafer with the thermocouple is heated to a constant temperature by irradiation with light from the halogen lamps HL, the temperature of the front surface of the wafer with the thermocouple is measured by the thermocouple, and the temperature of the back surface of the wafer with the thermocouple is measured by the lower radiation thermometer 20. Then, the emissivity of the lower radiation thermometer 20 is calibrated so that the temperature measured by the lower radiation thermometer 20 is equal to the temperature measured by the thermocouple. The emissivity accurately calibrated in this manner is set in the lower radiation thermometer 20.

When the temperature of the semiconductor wafer W is maintained at the preheating temperature T1 during the preheating, the temperature of the front surface of the semiconductor wafer W is measured by the upper radiation thermometer 25, and the temperature of the back surface of the semiconductor wafer W is measured by the lower radiation thermometer 20. In the stage of preheating, there arises no temperature difference between the front and back surfaces of the semiconductor wafer W, and the temperatures of the front and back surfaces are equal. For this reason, the emissivity of the upper radiation thermometer 25 is calibrated so that the temperature of the front surface of the semiconductor wafer W measured by the upper radiation thermometer 25 is equal to the temperature of the back surface of the semiconductor wafer W measured by the lower radiation thermometer 20. The calibrated emissivity is set in the upper radiation thermometer 25. Thus, the emissivity of the front surface of the semiconductor wafer W being treated is set in the upper radiation thermometer 25, and the emissivity set in the upper radiation thermometer 25 is accurately calibrated.

After the emissivity calibration of the upper radiation thermometer 25 is completed, temperature measurement by means of the upper radiation thermometer 25 starts (Step S4). The upper radiation thermometer 25 receives infrared light emitted from the front surface of the semiconductor wafer W to measure the temperature of the front surface. The upper radiation thermometer 25 in the present preferred embodiment performs data acquisition in two sampling rate (sampling interval) modes: a long-period mode (a first measurement mode) and a short-period mode (a second measurement mode). The data acquisition refers to a process in which the infrared sensor 29 of the upper radiation thermometer 25 acquires the signal of electromotive force produced in the photovoltaic detector 28. In the long-period mode, the data acquisition is performed at a sampling rate of 50 milliseconds (20 Hz), for example. In the short-period mode, on the other hand, the data acquisition is performed at a shorter sampling rate than in the long-period mode, e.g., at a sampling rate of 0.04 milliseconds (25 kHz). The upper radiation thermometer 25 executes the long-period mode and the short-period mode in parallel. In other words, the upper radiation thermometer 25 acquires data at a sampling rate of 50 milliseconds while acquiring data at a sampling rate of 0.04 milliseconds.

Of the two modes, all data (electromotive force signals) acquired in the long-period mode at a sampling rate of 50 milliseconds are sequentially converted into temperature values in the temperature conversion part 103. On the other hand, the temperature conversion part 103 cannot keep up with the sequential conversion of all data acquired in the short-period mode at a sampling rate of 0.04 milliseconds into temperature values because the sampling rate is extremely short. For this reason, the data acquired in the short-period mode are once stored in the storage part 107 of the temperature measurement unit 27 or the like, and the temperature conversion part 103 extracts and converts some of the data into temperature values, which will be described further below.

The flash lamps FL in the flash heating part 5 irradiate the front surface of the semiconductor wafer W held by the susceptor 74 with a flash of light (Step S5) at the point in time when a predetermined time period has elapsed since the temperature of the semiconductor wafer W reached the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface temperature of the semiconductor wafer W subjected to the flash heating by the flash irradiation from the flash lamps FL momentarily increases to a treatment temperature T2 of 1000° C. or higher, and thereafter decreases rapidly.

The front surface temperature of the semiconductor wafer W is measured by the upper radiation thermometer 25 continuously from the preheating to the flash heating. In the stage of preheating, the temperature measurement in the long-period mode is suitable because the rate of increase in temperature of the semiconductor wafer W by means of the halogen lamps HL is significantly lower than that by means of the flash heating, and the front surface temperature of the semiconductor wafer W changes more gradually. During the flash heating, on the other hand, the temperature measurement in the short-period mode is suitable because the front surface temperature of the semiconductor wafer W increases momentarily abruptly, so that there is apprehension that the maximum attained temperature of the front surface of the semiconductor wafer W cannot be captured by means of the long-period mode.

As mentioned above, the upper radiation thermometer 25 executes the long-period mode and the short-period mode in parallel. All of the data acquired in the long-period mode are converted into temperature values by the temperature conversion part 103. Thus, the front surface temperature of the semiconductor wafer W during the preheating is measured by the upper radiation thermometer 25.

Figure 10:
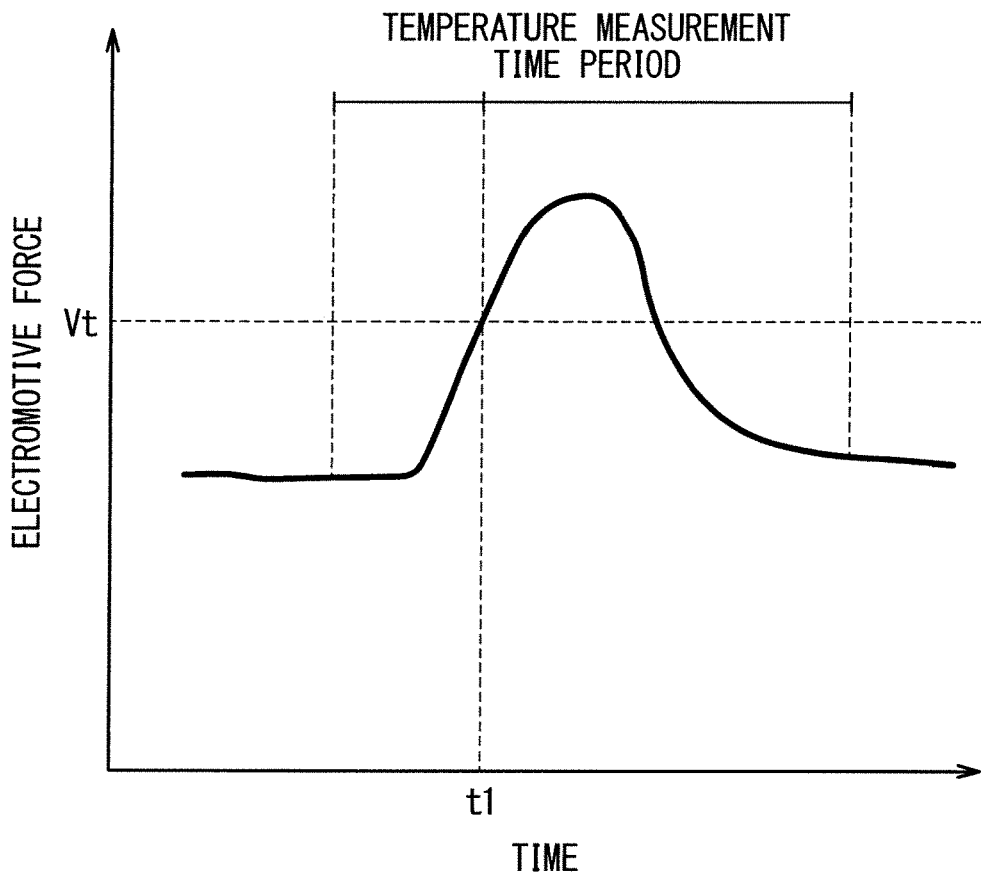
FIG. 10 is a graph for illustrating the extraction of some data from among data acquired in a short-period mode.

On the other hand, not all of the data acquired in the short-period mode are converted into temperature values, but some of those data are converted into temperature values by the temperature conversion part 103. It is necessary to extract some of the data which are acquired before and after the flash heating from among the data acquired in the short-period mode because the short-period mode is unnecessary except during the flash heating. FIG. 10 is a graph for illustrating the extraction of some data from among the data acquired in the short-period mode. FIG. 10 depicts the electromotive force data acquired in the short-period mode and accumulated in the storage part 107 or the like in chronological order along the time of acquisition. The higher the front surface temperature of the semiconductor wafer W being measured is, the higher electromotive force the photovoltaic detector 28 of the upper radiation thermometer 25 produces. In other words, when the front surface temperature of the semiconductor wafer W increases abruptly during the flash heating, the value of the electromotive force data acquired by the upper radiation thermometer 25 also increases.

In the present preferred embodiment, a threshold value Vt for the electromotive force data is set to trigger the extraction. The threshold value Vt may be, for example, a value obtained by adding a predetermined margin to the electromotive force value corresponding to the preheating temperature T1 during the preheating before the flash irradiation. The conversion from the preheating temperature T1 to the electromotive force value can be made because the preheating temperature T1 is known from a treatment recipe. In the example of FIG. 10, the electromotive force data acquired at time t1 reaches the threshold value Vt. Data acquired for a time period of 120 milliseconds in the range of 20 milliseconds before to 100 milliseconds after the time t1 when the data value reaches the threshold value Vt are extracted from among the data acquired in the short-period mode. Because of the sampling rate of 0.04 milliseconds in the short-period mode, 3000 data are extracted. Then, the temperature conversion part 103 converts the 3000 data for the time period of 120 milliseconds which are extracted from among the data acquired in the short-period mode into temperature values. In this manner, only the data acquired for a fixed time period before and after the time t1 when the data value reaches the threshold value Vt, among the data acquired in the short-period mode, are converted into temperature values, whereby changes in the front surface temperature of the semiconductor wafer W during the flash heating are accurately measured by the upper radiation thermometer 25.

Subsequently, the profile creation part 105 creates the temperature profile 108 showing changes in front surface temperature of the semiconductor wafer W over time from the preheating to the flash heating (Step S6). The front surface temperature of the semiconductor wafer W is being measured by the upper radiation thermometer 25. The upper radiation thermometer 25 measures the front surface temperature of the semiconductor wafer W in the two modes: the long-period mode and the short-period mode. Because of the sampling rate of 50 milliseconds in the long-period mode, the long-period mode is sufficient to follow the temperature changes during the preheating of the semiconductor wafer W by means of light irradiation from the halogen lamps HL, and is also suitable to capture the entire temperature changes of the semiconductor wafer W. However, only the long-period mode cannot follow momentary temperature changes during the flash heating of the semiconductor wafer W by means of the flash irradiation performed for a period of time ranging from 0.1 to 100 milliseconds. In other words, even if a temperature profile is created using only temperature values converted from the data acquired in the long-period mode, the temperature profile cannot precisely depict the temperature changes of the semiconductor wafer W especially during the flash heating. For this reason, the front surface temperature of the semiconductor wafer W during the flash heating is measured in the short-period mode with a sampling rate of 0.04 milliseconds.

The profile creation part 105 creates the temperature profile 108 by interpolating (combining) the temperature values obtained by the temperature conversion of the data acquired in the short-period mode into (with) the temperature values obtained by the temperature conversion of the data acquired in the long-period mode which serve as a base. This allows the temperature profile 108 to precisely depict changes in front surface temperature of the semiconductor wafer W also during the flash heating to depict changes in temperature of the semiconductor wafer W from the preheating to the flash heating with high accuracy.

Figure 11:
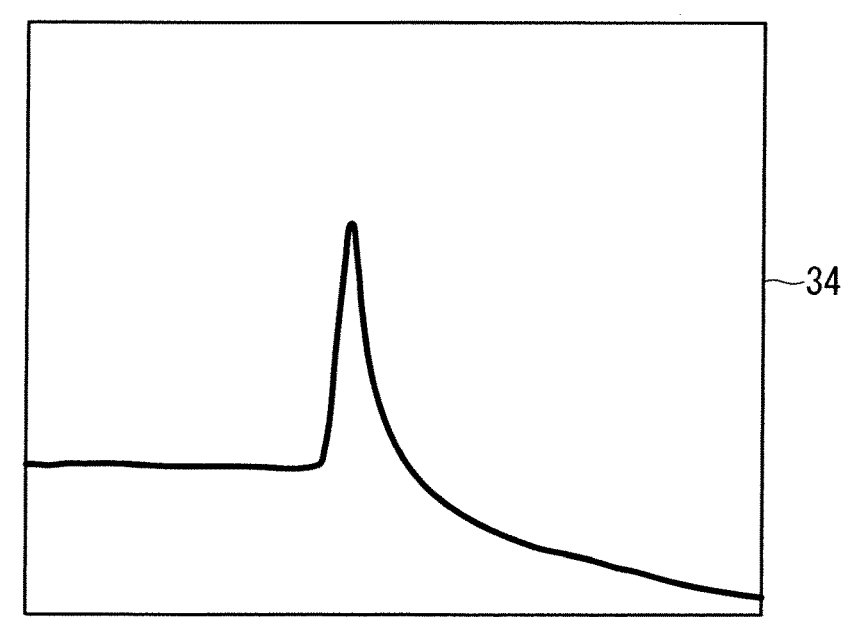
FIG. 11 is a graph showing a temperature profile displayed on a display part.

Next, the controller 3 displays the created temperature profile 108 on the display part 34 (Step S7). FIG. 11 is a graph showing the temperature profile 108 displayed the display part 34. The temperature profile 108 is a profile obtained by measuring changes in front surface temperature of the semiconductor wafer W from the preheating to the flash heating by means of the single upper radiation thermometer 25. The temperature profile 108 is also a profile obtained by interpolating the temperature values obtained by the temperature conversion of the data acquired in the short-period mode into the temperature values obtained by the temperature conversion of the data acquired in the long-period mode, and also appropriately depicts abrupt changes in front surface temperature of the semiconductor wafer W during the flash heating.

After a predetermined time period has elapsed since the completion of the flash heating treatment, the halogen lamps HL turn off. This causes the temperature of the semiconductor wafer W to decrease rapidly from the preheating temperature T1. The lower radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement by means of the lower radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 out of the chamber 6. Thus, the heating treatment of the semiconductor wafer W is completed (Step S8).

In the present preferred embodiment, the upper radiation thermometer 25 incorporating the photovoltaic detector 28 measures the front surface temperature of the semiconductor wafer W. As previously mentioned, the conventional photoconductive detector provided in the radiation thermometer for measuring the front surface temperature of a wafer has a poor signal-to-noise ratio in a low-frequency range and is required to be cooled below the freezing point. It is hence necessary to provide a light chopper. However, high-speed chopping on the order of microseconds requires a large blade to rotate at a high speed, which not only is impractical but also significantly increases the size of the temperature measurement system. For this reason, abrupt temperature changes during the flash irradiation have been detected in practice by providing a differentiating circuit in place of the light chopper. When the differentiating circuit is provided, it has been impossible to make the temperature measurement during the preheating which shows gradual temperature changes by means of light irradiation from the halogen lamps HL.

The upper radiation thermometer 25 including the photovoltaic detector 28 is capable of providing a good signal-to-noise ratio even in the low-frequency range and may be used at room temperature. This eliminates the need to provide the light chopper and the differentiating circuit in the upper radiation thermometer 25. Without the differentiating circuit, the temperature measurement of the semiconductor wafer W can be made during the preheating which shows gradual temperature changes. Thus, the use of the upper radiation thermometer 25 including the photovoltaic detector 28 allows the measurement of the front surface temperature of the semiconductor wafer W to be made with a simple configuration both during the preheating by means of light irradiation from the halogen lamps HL and during the flash irradiation from the flash lamps FL.

In the present preferred embodiment, the lower radiation thermometer 20 is used to calibrate the emissivity of the upper radiation thermometer 25 during the preheating prior to the flash irradiation. During the flash irradiation, there is apprehension that the semiconductor wafer W warps or vibrates due to an abrupt increase in temperature of the front surface of the semiconductor wafer W to preclude accurate measurement. The emissivity calibration of the upper radiation thermometer 25 prior to the flash irradiation allows the lower radiation thermometer 20 and the upper radiation thermometer 25 to make the temperature measurement of the semiconductor wafer W without being affected by wafer warping or vibration, thereby achieving proper calibration of the emissivity of the upper radiation thermometer 25.

In the present preferred embodiment, the upper radiation thermometer 25 performs the data acquisition at the two sampling rates, i.e. in the long-period and short-period modes. The long-period mode is suitable during the preheating of the semiconductor wafer W by means of the halogen lamps HL which provide gradual temperature changes. On the other hand, the short-period mode is suitable during the flash heating of the semiconductor wafer W by means of the flash lamps FL which provide abrupt temperature changes. That is, the upper radiation thermometer 25 executes the long-period mode and the short-period mode to acquire data, thereby enabling the temperature measurement of the semiconductor wafer W to be made appropriately both during the preheating and during the flash heating.

The upper radiation thermometer 25 uses common hardware to measure the temperatures of the semiconductor wafer W both during the preheating and during the flash heating. Because of complete differences in frequency band and signal intensity of the signals outputted from the infrared sensor 29 between the preheating and the flash heating, it is originally necessary to optimize the hardware for each of the preheating and the flash heating to obtain good signal-to-noise ratios. In the present preferred embodiment, a digital filter 104 is incorporated in the temperature conversion part 103 to process the signals outputted from the infrared sensor 29 both during the preheating and during the flash heating through the use of the common hardware (FIG. 8). In other words, the digital filter 104 is used to process a digital signal converted by the A/D converter 102 from the electromotive force signal outputted from the infrared sensor 29 that incorporates the photovoltaic detector 28. For an analog filter, it is necessary to change the entire hardware in order to change filter properties. However, a digital filter is capable of obtaining different filter properties by changing software incorporated in the same hardware. The present preferred embodiment is able to change the software incorporated in the common hardware to process the signals by means of the digital filter 104 that is different in properties between the preheating and the flash heating, thereby obtaining good signal-to-noise ratios. Specifically, for example, an IIR (Infinite Impulse Response) filter is used as the digital filter 104 during the preheating using the halogen lamps HL, and an FIR (Finite Impulse Response) filter is used as the digital filter 104 during the flash heating using the flash lamps FL.

While the preferred embodiment according to the present invention has been described hereinabove, various modifications of the present invention in addition to those described above may be made without departing from the scope and spirit of the invention. For example, although the upper radiation thermometer 25 includes the photovoltaic detector 28 in the aforementioned preferred embodiment, the lower radiation thermometer 20 may include the photovoltaic detector 28. The lower radiation thermometer 20 including the photovoltaic detector 28 may be used to measure the temperature of the back surface of the semiconductor wafer W during the preheating using the halogen lamp HL because the photovoltaic detector 28 is capable of measurement both during the preheating and during the flash heating.

In the aforementioned preferred embodiment, the sampling rate in the long-period mode is 50 milliseconds and the sampling rate in the short-period mode is 0.04 milliseconds. The present invention, however, is not limited to this. The sampling rate in each of the long-period and short-period modes may be set to any appropriate value. The sampling rate in each of the long-period and short-period modes may be set as appropriate according to the treatment conditions, such as the rate of increase in temperature of the semiconductor wafer W by means of the light irradiation from the halogen lamp HL and the flash irradiation time.

In the present preferred embodiment, the threshold value Vt that triggers the data extraction in the short-period mode is the value obtained by adding the predetermined margin to the electromotive force value corresponding to the preheating temperature T1. The present invention, however, is not limited to this. For example, in the electromotive force data depicted in chronological order as shown in FIG. 10, the threshold value Vt may be a value obtained by adding a predetermined margin to the electromotive force value x seconds (where x is an arbitrary value, e.g. 50 milliseconds) before the current time (arbitrary time point). This has the same meaning as the use of the slope of the electromotive force value greater than a predetermined value as a trigger for the data extraction. If the threshold value Vt is the value obtained by adding the predetermined margin to the electromotive force value corresponding to the preheating temperature T1, there is a danger of false detection of the trigger, for example, due to overshoots in temperature control during the preheating. However, such false detection is prevented if the threshold value Vt is the value obtained by adding the predetermined margin to the electromotive force value x seconds before the current time. Alternatively, the threshold value Vt may be a value obtained by adding a predetermined margin to the electromotive force value at the point in time when a signal for the execution of the flash irradiation is issued from the controller 3 several seconds before the emission of the flash lamps FL. Further, data for a predetermined time period after the point in time when the signal for the execution of the flash irradiation is issued may be converted into temperatures.

In the aforementioned preferred embodiment, the IIR filter is used as the digital filter 104 during the preheating, and the FIR filter is used as the digital filter 104 during the flash heating. The present invention, however, is not limited to this. For example, a state-space filter may be used.

A plurality of upper radiation thermometers 25 may be provided above the semiconductor wafer W held by the susceptor 74. The measurement positions of the respective upper radiation thermometers 25 differ from each other. Each of the upper radiation thermometers 25 includes the photovoltaic detector 28. In this case, the emissivity calibration may be performed on one of the upper radiation thermometers 25 based on the value of temperature measurement of the lower radiation thermometer 20 as in the aforementioned preferred embodiment, and the calibrated emissivity may be reflected in the other upper radiation thermometers 25. The temperature measurement position of the front surface of the semiconductor wafer W by means of the upper radiation thermometer 25 subjected to the emissivity calibration and the temperature measurement position of the back surface of the semiconductor wafer W by means of the lower radiation thermometer 20 are preferably symmetrical with respect to the semiconductor wafer W. This minimizes emissivity calibration errors resulting from the in-plane temperature distribution of the semiconductor wafer W. In addition, it is preferable that measurement conditions, such as field of view area and angle, are the same for all of the upper radiation thermometers 25. The provision of the plurality of upper radiation thermometers 25 allows temperature measurement at a plurality of points on the front surface of the semiconductor wafer W to thereby achieve multi-point control.

The photovoltaic detector 28 is made of InSb in the aforementioned preferred embodiment. The present invention, however, is not limited to this. For example, InAsSb (indium arsenide antimonide) or InAs (indium arsenide) may be used to form the photovoltaic detector 28.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiment, the filament-type halogen lamps HL are used as continuous lighting lamps that emit light continuously for not less than one second to perform the heating treatment for maintaining the substrate at a predetermined temperature. The present invention, however, is not limited to this. In place of the halogen lamps HL, discharge type arc lamps (e.g., xenon arc lamps) or LED lamps may be used as the continuous lighting lamps to perform the heating treatment.

While the invention has been described in detail, the foregoing description is in all aspects illustrative and not restrictive. It is understood that numerous other modifications and variations can be devised without departing from the scope of the invention.

What is claimed is:

1. A heat treatment apparatus for irradiating a substrate with a flash of light to heat the substrate, comprising:
    a chamber for receiving a substrate therein;

a continuous lighting lamp for irradiating said substrate with light to preheat said substrate;
a flash lamp for irradiating a front surface of said substrate with a flash of light to flash-heat said substrate; and
a first radiation thermometer including a photovoltaic detector and for measuring a temperature of said substrate,
a second radiation thermometer for measuring a temperature of said substrate,
wherein, during the execution of said preheating, said first radiation thermometer measures the temperature of the front surface of said substrate and said second radiation thermometer with a calibrated emissivity measures the temperature of a back surface of said substrate, and
wherein the emissivity set in said first radiation thermometer is calibrated based on the temperature of said substrate measured by said second radiation thermometer.

2. A heat treatment apparatus for irradiating a substrate with a flash of light to heat the substrate, comprising:
    a chamber for receiving a substrate therein;
    a continuous lighting lamp for irradiating said substrate with light to preheat said substrate;
    a flash lamp for irradiating a front surface of said substrate with a flash of light to flash-heat said substrate; and
    a first radiation thermometer including a photovoltaic detector and for measuring a temperature of said substrate,
    wherein said first radiation thermometer executes a first measurement mode and a second measurement mode in parallel to measure the temperature of said substrate,
    said first measurement mode being a measurement mode in which data acquisition is performed at a first sampling interval,
    said second measurement mode being a measurement mode in which data acquisition is performed at a second sampling interval shorter than said first sampling interval.

3. The heat treatment apparatus according to claim 2, further comprising
    a temperature conversion part for converting data acquired for a fixed time period before and after a point in time when a data value reaches a predetermined threshold value, among data acquired in said second measurement mode, into temperatures.

4. The heat treatment apparatus according to claim 3, wherein said temperature conversion part converts all data acquired in said first measurement mode into temperatures.

5. The heat treatment apparatus according to claim 4, further comprising
    a display part for displaying a result of interpolation of temperature values obtained by temperature conversion of data acquired in said second measurement mode into temperature values obtained by temperature conversion of data acquired in said first measurement mode.

6. A heat treatment apparatus for irradiating a substrate with a flash of light to heat the substrate, comprising:
    a chamber for receiving a substrate therein;
    a continuous lighting lamp for irradiating said substrate with light to preheat said substrate;
    a flash lamp for irradiating a front surface of said substrate with a flash of light to flash-heat said substrate; and
    a first radiation thermometer including a photovoltaic detector and for measuring a temperature of said substrate, wherein a process using a digital filter is performed on a signal outputted from said photovoltaic detector.

7. The heat treatment apparatus according to claim 6, wherein different digital filters are used in said preheating and said flash heating.

* * * * *